United States Patent
Jung et al.

(10) Patent No.: US 6,600,006 B2
(45) Date of Patent: Jul. 29, 2003

(54) POSITIVE-TYPE PHOTOSENSITIVE POLYIMIDE PRECURSOR AND COMPOSITION COMPRISING THE SAME

(75) Inventors: Myung Sup Jung, Daejun-Shi (KR); Sung Kyung Jung, Daejun-Shi (KR); Yong Young Park, Daejun-Shi (KR); Bong Seok Moon, Daejun-Shi (KR); Bong Kyu Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/032,133

(22) Filed: Dec. 31, 2001

(65) Prior Publication Data

US 2002/0093077 A1 Jul. 18, 2002

(30) Foreign Application Priority Data

Dec. 29, 2000 (KR) .......................... 2000-85109
Nov. 10, 2001 (KR) .......................... 2001-69936

(51) Int. Cl.$^7$ .............................. C08G 73/12
(52) U.S. Cl. .................. 528/353; 528/170; 528/26; 528/125; 528/126; 528/128; 528/171; 528/172; 528/173; 528/174; 528/176; 528/183; 528/185; 528/220; 528/229; 528/272; 430/270.1; 525/436
(58) Field of Search ................. 528/170, 26, 353, 528/125, 126, 128, 171, 172–173, 174, 176, 183, 185, 220, 229, 350, 272; 430/270.1; 525/436

(56) References Cited

U.S. PATENT DOCUMENTS

| | | | | |
|---|---|---|---|---|
| 3,957,512 A | | 5/1976 | Kleeberg et al. .............. 96/35.1 |
| 4,243,743 A | | 1/1981 | Hiramoto et al. ........... 430/281 |
| 5,288,835 A | * | 2/1994 | Irwin .......................... 528/182 |
| 5,518,864 A | * | 5/1996 | Oba et al. .................... 430/165 |
| 5,609,914 A | * | 3/1997 | Ma et al. ..................... 347/106 |
| 6,342,333 B1 | * | 1/2002 | Sasaki et al. ............. 430/270.1 |
| 6,436,593 B1 | * | 8/2002 | Minegishi et al. .......... 430/176 |

FOREIGN PATENT DOCUMENTS

| | | |
|---|---|---|
| JP | 60-37550 | 2/1960 |
| JP | 52-13315 | 2/1977 |
| JP | 62-135824 | 6/1987 |
| JP | 64-60630 | 3/1989 |
| JP | 7-33874 | 2/1995 |
| JP | 7-134414 | 5/1995 |

* cited by examiner

Primary Examiner—P. Hampton-Hightower
(74) Attorney, Agent, or Firm—Lee & Sterba, P.C.

(57) ABSTRACT

A polyamic ester prepared by partially substituting hydrogen atoms of carboxylic groups of a polyamic acid with acid labile groups, the polyamic ester comprising one or more repeating units represented by Formula 1, and each of at least one terminal of the polyamic ester molecule terminates with the same or different reactive end-capping monomer:

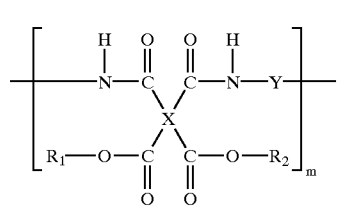

Formula (1)

wherein in Formula 1,

$R_1$ and $R_2$ are independently a hydrogen atom, or an acid labile group;

X is a tetravalent, an aromatic or an aliphatic organic group;

Y is a divalent, an aromatic or an aliphatic organic group; and m is an integer equal to or greater than 1.

22 Claims, 2 Drawing Sheets

POSITIVE-TYPE PHOTOSENSITIVE POLYIMIDE PRECURSOR AND COMPOSITION COMPRISING THE SAME

BACKGROUND OF THE INVENTION

1. Field of the Invention

The present invention relates to a positive-type photosensitive polyimide precursor and a composition comprising the same. More specifically, the present invention relates to a polyamic ester having one or more reactive end-capping groups at either or both terminals of its molecular chain, wherein the ester structure of the polyamic ester degrades to yield carboxylic acid upon generation of acid by exposure; a mixture of at least one polyamic ester and at least one polyamic acid, the polyamic acid also having one or more reactive end-capping groups at either or both terminals of its molecular chain; and a composition comprising the mixture for use as a photosensitive polyimide precursor material.

2. Description of Background Art

In the field of semiconductor devices, and especially in the areas of semiconductor memory devices and liquid crystal display (LCD) devices, much effort has been made to date to improve the level of integration, densification, integrity, reliability and speed of semiconductor devices. In this connection, many advantages of organic materials, such as facility of processing and purification, are noteworthy. However, only those organic materials that are thermally stable at a temperature of 200° C. or higher may be used in this field.

Polyimide resins were approved suitable for the purposes as described above because of the following reasons: Polyimide resins exhibit excellent thermal resistance and mechanical strength while possessing excellent electrical properties by virtue of having a low dielectric constant and a high insulation capacity. Polyimide resins also provide coating films that exhibit excellent planation properties. The low level of impurities in polyimide resins also helps to increase the integrity and reliability of final semiconductor devices. From an application perspective, polyimide resins are easy to process in forming fine patterns.

Generally, polyimide resins are produced by a two-step condensation polymerization method. First, diamine and dianhydride are subjected to polymerization in a polar solvent such as NMP, DMAc or DMF to provide a polyimide precursor solution. Second, the polyimide precursor solution is coated onto a silicon wafer or a glass substrate and then cured through heat treatment. Commercial polyimide products for use in electronic industry are supplied as a polyimide precursor solution or as a polyimide film. In the field of semiconductor devices, polyimide precursor solutions are commonly used.

Figure 1:
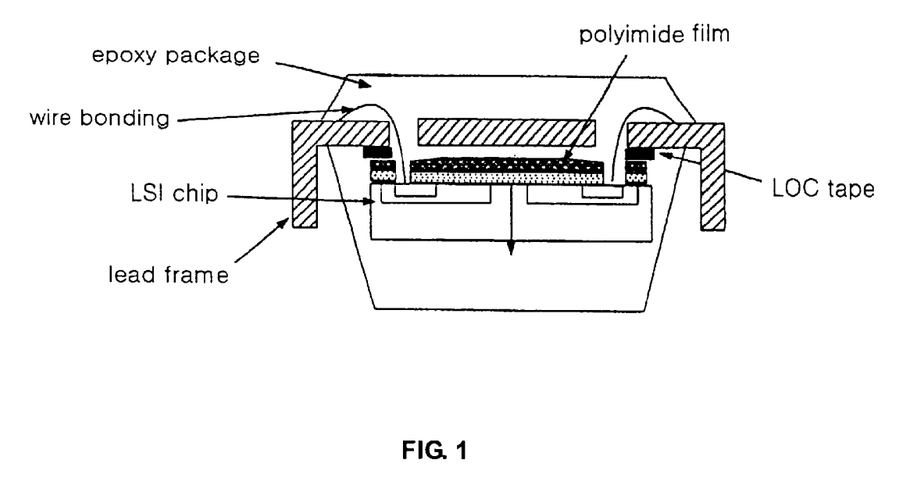
FIG. 1 is a sectional view showing a structure of a semiconductor device, wherein a polyimide film is applied as a buffer coating film.
Figure 2A:
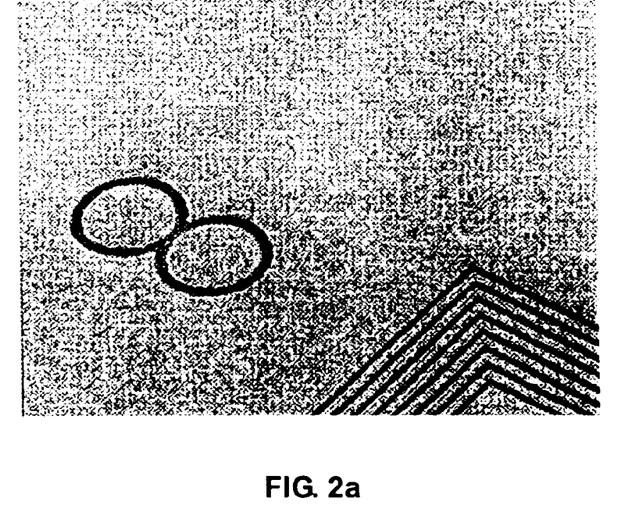
FIG. 2a is a photograph showing a pattern having a line width of 8 μm formed in a 10 μm-thick film made from a polyimide precursor composition according to an embodiment of the present invention.
Figure 2B:
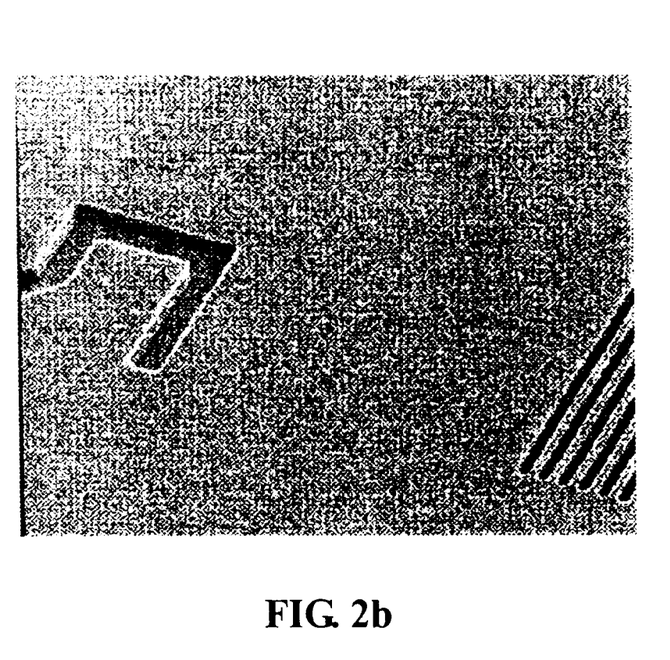
FIG. 2b is a photograph showing a pattern with a line width of 5 μm formed in a 10 μm-thick film made from a polyimide precursor composition according to an embodiment of the present invention.

FIG. 1 shows a sectional structure of a semiconductor device, wherein a polyimide resin is applied in a buffer coating film of the device. Plastic packages of large scale integration (LSI) are subject to various physical forces, including contraction after a packaging process as well as thermal stress due to differences in coefficients of thermal expansion between a chip and the resin. These physical forces result in either cracks in a passivation film or damage to metal lines or both. In order to alleviate these types of problems, a buffer layer is formed between the chip and the package using a polyimide film. In order to obtain a buffer effect, the thickness of the polyimide film buffer layer should be at least 10 $\mu$m. Generally, thicker polyimide films result in increased buffer effects and helps to increase final production yield of semiconductor products. As shown in FIG. 1, fine patterns should be formed in the polyimide film, such as interconnection of electrodes and wire bonding pads. Typically, via holes in a polyimide film are formed by coating a conventional photoresist onto the polyimide film and etching the photoresist film. Recently, several photosensitive polyimides have been proposed, which were prepared by modifying polyimides to have inherent photosensitivity.

When conventional non-photosensitive polyimides are used in the buffer coating film, a separate etching process is required, and via holes for wire bonding and connections between metal lines are formed by using a photoresist. When photosensitive polyimides are employed, the use of a photoresist can be omitted. The elimination of the need for the photoresist reduces the overall buffer coating process by about 50% and results in higher productivity and lower production costs. Additionally, the final steps in the assembling process is reduced, which in turn further contributes to enhancing final production yield. Based on these advantages, research on photosensitive polyimides has been actively pursued.

The first practical photosensitive polyimide was developed by Rubner et al. on behalf of Siemens AG, Germany (U.S. Pat. No. 3,957,512), wherein photosensitive groups are attached to a polyimide precursor, i.e., polyamic acid via ester bonds. According to this U.S. patent, a polyimide precursor solution is coated onto a substrate to form a film, and the film is exposed to UV light so that photopolymerization can occur in the exposed region and form cross-linkages between the precursor molecules. The film is then subjected to development using an organic solvent to remove unexposed regions, followed by thermal treatment. During the thermal treatment, an imidization reaction occurs, and the ester-bonded photosensitive groups degrade to provide a desired pattern made of polyimide.

U.S. Pat. No. 4,243,743 assigned to Toray Co., Ltd., Japan, proposes a photosensitive polyimide, wherein photosensitive groups and compounds with an amino group are attached to a polyamic acid via ion bonds. Such a photosensitive polyimide is advantageous over conventional photosensitive polyimides from the standpoint of ease in preparation and relatively fewer toxic side products.

Currently, photosensitive polyimides are preferred over negative-type photosensitive polyimides, because positive-type photosensitive polyimides exhibit superior resolution. Moreover, positive-type photosensitive polyimides have a relatively small area of exposure and, consequently, are associated with a lower frequency of inferior products. Additionally, alkaline solutions are used as a developer for positive-type photosensitive polyimides, and since alkaline solutions to not generate environmental pollution issues, they enable reduction of processing costs. Negative-type photosensitive polyimides, on the other hand, use toxic organic solvents such as NMP and DMAc as developers and are problematic considering the cost factor and the environmental pollution caused by the liquid waste products. Production of positive-type photosensitive polyimides, however, has not been truly commercialized to date because of a large difficulty that must be overcome.

In prior art teachings relative to positive-type photosensitive polyimides, Japanese Laid-Open Publication Nos. 52-13315 and 62-135824 disclose a patterning method whereby a pattern is formed by virtue of the different dissolution rate of exposed and unexposed regions while using a mixture of polyamic acid as a polyimide precursor and naphthoquinonediazide as a dissolution inhibitor. Japanese Laid-Open Publication No. 64-60630 discloses a method for patterning using a mixture of soluble polyimide having hydroxyl groups and naphthoquinonediazide. Japanese Laid-Open Publication No. 60-37550 discloses a method for patterning by using a photosensitive polyimide, wherein the photosensitive polyimide was prepared through connecting an o-nitrobenzylester group as a photosensitive group to a polyimide precursor via an ester bond. These prior art teachings, however, are not satisfactory because of the following disadvantages. Firstly, the difference in dissolution rate between exposed regions and unexposed regions is not sufficient to form a pattern having high resolution (See: Japanese Laid-Open Publication Nos. 52-13315 and 62-135824). Secondly, the prior polyimide precursors are limited in structure and are poor in transparency and other physical properties (See: Japanese Laid-Open Publication No. 60-37550). Thirdly, the relatively low sensitivity makes an increase of film thickness difficult (See: Japanese Laid-Open Publication No. 60-37550). Fourthly, a photosensitizer with high absorbance is required in large amounts, and as a result, the transparency of final compositions decreases and makes it difficult to form a pattern of high resolution.

Alternatively, a chemical amplification-type resin composition was recently proposed by Nitto Denko Co., Ltd, Japan, which chemical amplification-type resin composition was prepared by mixing a resin and a photo acid generator. The resin was obtained from substitution of carboxylic groups in polyamic acid with acetal groups that can be dissociated by acid. (See: Japanese Laid-Open Publication Nos. 7-33874 and 7-134414). A patterned film made from the composition was shown to have good residual percentage of film, but poor post-curing shrinkage and elongation of film because of a low degree of imidization of the acetal-substituted polyamic acid. Typically, in order to achieve excellent processing properties during a patterning process, a resin composition should contain as much solid resin as possible while maintaining low viscosity. If, however, the molecular weight of the resin is reduced for this purpose, deterioration of physical properties of final films, such as elongation, became more significant. This result makes it difficult to make common use prior art resins.

SUMMARY OF THE INVENTION

A feature of an embodiment of the present invention is to provide a polyamic ester with a novel structure, affording a film with excellent elongation, wherein acid labile groups are introduced into carboxylic groups of a polyamic acid to yield the polyamic ester and one or more reactive end capping monomers are added to either or both terminals of the molecular chain of the polyamic ester.

Another feature of an embodiment of the present invention is a mixture of polyimide precursors comprising at least one polyamic ester and at least one polyamic acid, wherein reactive end-capping groups that can cross-link each other upon thermal curing were added to either or both terminals of respective molecular chains of the polyamic ester and the polyamic acid. In doing so, the molecular weight of the polymers before curing can be lowered enough to optimize the balance of solid content and viscosity of a final resin composition, while obtaining a film of high quality through curing that exhibits excellent properties including minimal film shrinkage.

Yet another feature of the present invention is a photosensitive polyimide precursor composition comprising the mixture of polyimide precursors that can form films of high quality and excellent elongation.

According to an embodiment of the present invention, there is provided a polyamic ester prepared by partially substituting hydrogen atoms of carboxylic groups of a polyamic acid with acid labile groups, wherein the polyamic ester comprises one or more repeating units represented by the Formula 1, and each of at least one terminal of the polyamic ester molecule terminates with the same or different reactive end-capping monomer:

Formula (1)

In Formula 1,

$R_1$ and $R_2$ are independently a hydrogen atom or an acid labile group;

X is a tetravalent, an aromatic or an aliphatic organic group;

Y is a divalent, an aromatic or an aliphatic organic group; and m is an integer equal to or greater than 1.

Accordingly to another embodiment of the present invention, there is provided a polyimide precursor mixture comprising at least one polyamic ester and at least one polyamic acid, wherein the polyamic acid comprises one or more repeating units represented by the following Formula 6, wherein each of at least one terminal of the polyamic acid molecule terminates with the same or different reactive end-capping monomer:

Formula (6)

In Formula 6,

X is a tetravalent, an aromatic or an aliphatic organic group;

Y is a divalent, an aromatic or an aliphatic organic group; and n is an integer equal to or greater than 1.

According to another embodiment of the present invention, there is provided a photosensitive polyimide precursor composition comprising (a) the polyimide precursor mixture, (b) one or more photo acid generators and (c) one or more polar solvents.

These and other features and aspects of the present invention will be readily apparent to those of ordinary skill in the art upon review of the detailed description that follows.

DETAILED DESCRIPTION OF THE INVENTION

Priority Korean Patent Application No. 2000-85109, filed on Dec. 29, 2000, and Korean Patent Application No. 2001-69936 filed on Nov. 10, 2001, are incorporated herein in their entirety by reference.

The polyamic ester of the present invention is a polymer resin derived from partial substitution of hydrogen atoms of carboxylic groups of a polyamic acid molecule with acid labile groups, wherein the polyamic ester comprises one or more repeating units represented by the following Formula 1, and each of at least one terminal of the polyamic ester molecule terminates with the same or different reactive end-capping monomer:

Formula (1)

In the above Formula 1,

$R_1$ and $R_2$ are independently a hydrogen atom or an acid labile group;

X is a tetravalent, an aromatic or an aliphatic organic group;

Y is a divalent, an aromatic or an aliphatic organic group; and m is an integer equal to or greater than 1.

In the above Formula 1, the acid labile group is a functional group capable of binding to a carboxylic group and degrading to yield carboxylic acid upon generation of acid by exposure. Such a functional group can be exemplified by a —$CHR_3$—O—$R_4$ group, a tert-butyl group and a trimethylsilyl group. The —$CHR_3$—O—$R_4$ group binds to a carboxylic group to form an acetal structure, wherein $R_3$ is a hydrogen atom or a $C_{1\sim20}$ saturated or unsaturated hydrocarbon or aromatic organic group, which may contain one or more heteroatoms; $R_4$ is a $C_{1\sim20}$ saturated or unsaturated hydrocarbon or aromatic organic group, which may contain one or more heteroatoms; and $R_3$ and $R_4$ may be interconnected to form a ring structure. The tert-butyl group and the trimethylsilyl group bind to a carboxylic group to form a t-BOC group and a trimethylsilyoxyl group, respectively, which can be degraded by acid. Some of the acid labile groups are shown in the following Formula 2:

Formula (2)

Other examples of acid labile groups include menthyl, isobornyl, 2-methyl-2-adamantyl, 3-oxocyclohexyl, mevalonic lactonyl, dicyclopropylmethyl (Dcpm), and dimethylcyclopropylmethyl (Dmcp) groups.

As for the total number of the acid labile groups in the polyamic ester, the value of b/(a+b) should fall within a range of 0.1~1.0, wherein "a" represents the total number of hydrogen atoms contained in the carboxylic groups of one polyamic ester molecule, and "b" represents the total number of acid labile groups contained in carboxylic groups of the same polyamic ester molecule. In a developing process using an alkaline solution as a developer, the dissolution rate of the polyimide precursor of the present invention varies depending on this ratio.

In the above Formula 1, X is a tetravalent, an aromatic or an aliphatic organic group. The aromatic organic group is, preferably, selected from the functional groups shown in the following Formula 3:

Formula (3)

The tetravalent organic groups were derived from tetracarboxylic dianhydrides having the structure of the following formula (4):

Formula (4)

In the above Formula 4, X is as defined in the above Formula 1.

Specific examples of compounds of the above Formula 4 include pyromellitic dianhydride; 3,3',4,4'-biphenyl tetracarboxylic dianhydride; 4,4'-oxydiphthalic dianhydride; 3,3',4, 4"-benzophenone tetracarboxylic dianhydride; 2,2'-bis(3,4-benzenedicarboxylic anhydride)perfluoropropane; and 4,4'-sulfonyldiphthalic dianhydride. Preferably, pyromellitic dianhydride; 3,3',4,4'-biphenyl tetracarboxylic dianhydride; and 4,4'-oxydiphthalic dianhydride are used alone or in combination with each other.

In the above Formula 1, Y is a divalent, an aromatic or an aliphatic organic group, which are derived from diamines represented by the following Formula 5:

Formula (5)

Exemplary compounds of the above Formula 5, specifically containing an aromatic ring, include m-phenylenediamine; p-phenylenediamine; 4,4'-diaminodiphenylmethane; 4,4'-diaminodiphenylether; 2,2'-bis(4-aminophenyl)propane; 4,4'-diaminophenylsulfone; 3,3',4,4'-diaminodiphenylsulfone; 4,4'-diaminodiphenylsulfone; 1,4-bis(3-aminophenoxy)benzene; 1,4-bis(4-aminophenoxy)benzene; 1,4-bis(p-aminophenylsulfonyl)benzene; 1,4-bis(m-aminophenylsulfonyl)benzene; 2,2'-bis[4-(4-aminophenoxy)phenyl]propane; bis[4-(4-aminophenoxy)phenyl]methane; bis[3,5-dimethyl-4-(4-aminophenoxy)methyl]methane; bis[4-(4-aminophenoxy)phenyl]sulfone; and 2,2'-bis[4-(4-aminophenoxy)phenyl]perfluoropropane. These compounds may be used alone or in combination with each other. Particularly, one or more compounds selected from the group consisting of 4,4'-diaminodiphenylether; 2,2'-bis(4-aminophenyl)propane; and 4,4'-diaminodiphenylsulfone are preferred.

The polyamic ester of the present invention is prepared by synthesizing polyamic acid and then subjecting the polyamic acid to esterification along with the acid labile groups as described above. Residual impurities produced during the process of preparing the polyamic ester deteriorates the transparency and physical properties of a final film. Therefore, transparency should be improved in advance for obtaining a pattern of high resolution even at a film thickness of 10 μm or more.

According to the present invention, the improvement of transparency of the final film may be accomplished by using a mixture of polyamic ester and polyamic acid. Generally, polyamic acid has better transparency than polyamic ester, and thus using polyamic ester together with one or more polyamic acids can enhance transparency in proportion to the quantity of polyamic acid used. In addition, inherent qualities of polyamic acid increases the dissolution rate in a developing process and improves physical properties of a cured film. Also, polyamic acid is easy to modify due to the absence of any photosensitive group, and therefore adhesive strength of a final resin composition to a substrate can be readily enhanced through the introduction of siloxane moieties into a molecular chain of polyamic acid.

Polyamic acid as used in the present invention is a polymer resin, comprising one or more repeating units represented by the following Formula 6, and each of at least one terminal of the polyamic acid molecule terminates with the same or different reactive end-capping monomer:

Formula (6)

In the above Formula 6,

X is a tetravalent, an aromatic or an aliphatic organic group;

Y is a divalent, an aromatic or an aliphatic organic group; and n is an integer equal to or greater than 1.

In the above Formula 6, X is a tetravalent, an aromatic or an aliphatic organic group, and the aromatic organic group is, preferably, selected from the functional groups shown in the following Formula 3:

Formula (3)

The tetravalent organic groups were derived from tetra-carboxylic dianhydrides having the structure of the following Formula 4:

Formula (4)

In the above Formula 4, X is as defined in the above Formula 6.

Specific examples of compound of the above Formula 4 include pyromellitic dianhydride; 3,3',4,4'-biphenyl tetracarboxylic dianhydride; 4,4'-oxydiphthalic dianhydride; 3,3',4, 4"-benzophenone tetracarboxylic dianhydride; 2,2'-bis(3,4-benzenedicarboxylic anhydride)perfluoropropane; and 4,4'-sulfonyldiphthalic dianhydride. Preferably, pyromellitic dianhydride; 3,3',4,4'-biphenyl tetracarboxylic dianhydride; and 4,4'-oxydiphthalic dianhydride are used alone or in combination with each other.

In the above Formula 6, Y is a divalent, an aromatic or an aliphatic organic group, which are derived from diamines represented by the following Formula 5:

$$H_2N—Y—NH_2 \quad \text{Formula (5)}$$

Exemplary compounds of the above Formula 5, specifically containing an aromatic ring, include m-phenylenediamine; p-phenylenediamine; 4,4'-diaminodiphenylmethane; 4,4'-diaminodiphenylether; 2,2'-bis(4-aminophenyl)propane; 4,4'-diaminophenylsulfone; 3,3',4,4'-diaminodiphenylsulfone; 4,4'-diaminodiphenylsulfone; 1,4-bis(3-aminophenoxy)benzene; 1,4-bis(4-aminophenoxy)benzene; 1,4-bis(p-aminophenylsulfonyl)benzene; 1,4-bis(m-aminophenylsulfonyl)benzene; 2,2'-bis[4-(4-aminophenoxy)phenyl]propane; bis[4-(4-aminophenoxy)phenyl]methane; bis[3,5-dimethyl-4-(4-aminophenoxy)methyl]methane; bis[4-(4-aminophenoxy)phenyl]sulfone; and 2,2'-bis[4-(4-aminophenoxy)phenyl]perfluoropropane. These compounds may be used alone or in combination with each other. Particularly, one or more compounds selected from the group consisting of 4,4'-diaminodiphenylether; 2,2'-bis(4-aminophenyl)propane; and 4,4'-diaminodiphenylsulfone are preferred.

Preferably, in the above Formula 6, 1~50% of Y groups may be replaced by siloxane units. The representative structure of the siloxane unit is shown in the following Formula 7:

Formula (7)

In the above Formula 7, $R_5$, $R_6$, $R_7$ and $R_8$ are independently an alkyl, an aryl, an alkoxy or a hydroxyl group, which may contain one or more heteroatoms;

$R_9$ and $R_{10}$ are independently an alkyl or an aryl group; and k is an integer equal to or greater than 1.

Polyamic acid containing such siloxane units can be obtained by synthesizing polyamic acid with the use of polysiloxanediamine of the following Formula 8 as a co-monomer:

Formula (8)

In the above Formula 8,

$R_{5~10}$ and k are as defined in the above Formula 7.

According to a preferred embodiment of the present invention, the polyamic ester and the polyamic acid have one or more reactive end-capping monomers at either or both terminals of their molecular chains, respectively. Introduction of a reactive end-capping monomer into a terminal of a molecular chain of a polymer results in a decrease of molecular weight of the polymer. This leads to a reduction of viscosity of a final resin composition comprising the polymer and allows for easy processing.

During a thermal curing process following a patterning process, the reactive end-capping monomers form cross-linkages between the polymer molecules. The molecular weight of the polymers is thereby sufficiently increased to enhance physical properties of the final film. Particularly, in the case that both terminals of the molecular chains of respective polymers terminate with reactive end-capping monomers, the effect expected from mixing polyamic ester and polyamic acid is maximized. This is due to the observation that until the patterning process is completed, the polymers, i.e., polyamic ester and polyamic acid, maintain their respective unique properties, and thereby exhibit high transparency and dissolution rate as well as low viscosity, whereas during the curing process, cross-linkages are evenly formed between the reactive end-capping monomers of polyamic ester and polyamic acid, and thus the molecular weight of the polymers is increased.

Preferred reactive end-capping monomer is one or more selected from the group consisting of monoamines or monoanhydrides having a C—C double bond, which has a single functional group. Such reactive end-capping monomers terminate condensation polymerization while constituting terminal group(s) of the resulting polymer. Thereafter, in a radical reaction, cross-linkages are formed between the C . C double bonds.

Representative examples of reactive end-capping monomers include 5-norbornene-2,3-dicarboxylic anhydride (NDA); 3,4,5,6-tetrahydrophthalic anhydride; cis-1,2,3,6-tetrahydrophthalic anhydride; maleic anhydride (MA); 2,3-dimethylmaleic anhydride (DMMA); citraconic anhydride (CA); itaconic anhydride (IA); and ethynylaniline (EA). Preferably, NDA of the following Formula 9, IA of the following Formula 10, or DMMA of the following Formula 11 are used:

Formula (9)

Formula (10)

Formula (11)

In the polyimide precursor mixture of the present invention, the mixing proportion of the polyamic ester and the polyamic acid should fulfill the weight ratio of A/(A+B) ranging from 0.05 to 0.95, wherein "A" represents the total weight of the polyamic ester, and "B" represents the total weight of the polyamic acid. Depending on this ratio, transparency, viscosity, dissolution rate of an exposed region, residual percentage of an unexposed region, and other physical properties of a final film will be varied.

According to the present invention, a photosensitive polyimide precursor composition can be readily prepared by adding to the polyimide precursor mixture of the present invention any conventional photo acid generator and polar solvent.

As the photo acid generator, any compound can be used provided that it will generate an acid when exposed to light. Specifically, a non-ionic photo acid generator can be exemplified by halogenated compounds forming HX, and sulfonyl compounds forming sulfonic acid, and nitrobenzyl ester compounds. An ionic photo acid generator can be exemplified by ammonium salts, diazonium salts, iodonium salts, sulfonium salts, phosphonium salts, onium salts of polymers, selenium salts, and arsenium salts.

Preferably, as a non-ionic photo acid generator, diazonaphthoquinones (DNQ) of the following Formula 12 or compounds forming sulfonic acid, such as nitrobenzylsulfonates of the following Formula 13, aromatic sulfonic acid esters of the following Formula 14 and aromatic sulfamides of the following Formula 15, can be used.

Formula (12)

In the above Formula 12,
$Q_1$ and $Q_2$ are independently monovalent or more alkyl or aryl group; and
h and g are independently an integer equal to or greater than 1.

Formula (13)

Formula (14)

Formula (15)

In the above Formulas 13 to 15,
$R_{11}$ is an alkyl or an aryl group, which may contain one or more heteroatoms; and
j is an integer of 1 to 3.

As an ionic photo acid generator, triaryl sulfonium salts such as $Ph_3S^+SbF_6^-$, $Ph_3S^+TosO^-$, and $Ph_3S^+TfO^-$; aliphatic sulfonium salts; iodonium salts such as $Ph_2I^+AsF_6^-$ and $Ph_2I^+PF_6^-$; diphenyliodonium salts of aromatic sulfonic acid represented by the following Formula 16; and diazonium salts such as $RO-C_6H_4-N_2^+SbF_6^-$ are preferred.

Formula (16)

In the above Formula 16,
$R_{12}$, $R_{13}$ and $R_{14}$ are independently an alkyl, an aryl, an alkoxy or a hydroxyl group;
$Ar_1$ is a phenyl, a naphthalene or an anthracene group;
I is an integer of 1 to 5; and
in the case where $1 \geq 2$, each $R_{12}$ may be different.

Any polymer-type photo acid generator may be used in the present invention. These photo acid generators as enumerated above can be used alone or in combination. The photo acid generator is added to the polyimide precursor composition of the present invention in an amount of 0.1 to 50 weight parts, preferably 5 to 30 weight parts, based on 100 weight parts of the polyimide precursor mixture consisting of at least one polyamic ester and at least one polyamic acid. If the photo acid generator content is less than 0.1 weight parts, then photosensitivity of the resulting composition decreases. If the photo acid generator content exceeds 50 weight parts, then transparency of the resulting composition decreases, which makes it difficult to increase film thickness and further makes the physical properties of the film poor.

The polar solvent used in the present invention, preferably, is one or more selected from the group consisting of N-methyl-2-pyrrolidone; N,N'-dimethylacetamide; dimethylformamide; dimethyl sulfoxide; acetonitrile; diglyme (diethylene glycol dimethyl ether); y-butyrolactone; phenol; cresol; xylenol; hexamethylenephosphoric triamide; and pyridine. More preferably, N-methyl-2-pyrrolidone or γ-butyrolactone is used. If desired, these solvents may be used in combination with other general purpose solvents, such as toluene, cyclohexanone, cyclohexane and hexane.

Besides the components as mentioned above, a sensitizer, an auxiliary adhesive agent, a dissolution inhibitor, an antioxidant agent and/or other additives may be added to the composition of the present invention. Particularly, one or more compounds having a hydroxyl group, which are selected from the group consisting of alcohols, benzylalcohols and phenols, may be added to the composition of the present invention as supplementary additives. More preferably, phenolic compounds may be added.

In the composition of the present invention, solid content, i.e., sum of the content of polyamic ester, polyamic acid and photo acid generator, depends on the desired thickness of a film to be formed. Preferably, the solid content ranges from 5 to 60 wt %. If the solid content is more than 60 wt %, then problems occur in a coating process due to the high viscosity of the resulting composition.

The polyimide precursor composition of the present invention is a positive-type, and requires, as a developer, not an organic solvent but an alkaline solution that is in harmony with the environment as well as being economical. The alkaline developer includes aqueous solutions of quarternary ammonium hydroxides such as tetramethylammoniumhydroxide and tetraethylammoniumhydroxide, and amine-based aqueous solutions such as ethanolamine and propylamine. Particularly, 2.38 wt % aqueous tetramethylammoniumhydroxide (TMAH) solution is most preferred.

By use of the photosensitive resin composition of the present invention, patterned, heat-resistant polyimide films can be readily formed on substrates such as glass plate and silicon wafer. In this connection, the resin composition may be coated onto such substrates through spin coating, bar coater, screen printing, etc. A coating film thus formed should have a thickness of 0.5 to 25 $\mu$m. As the film becomes thicker, the resolution of the film is lowered. After coating, the film is subjected to prebaking at a temperature of between about 50 to 150° C. for between about 4 to 15 minutes to evaporate the solvent and provide a prebaked film. Next, the prebaked film is exposed to UV light by using a patterned photomask. In the exposure, the quantity of light irradiated, preferably, ranges from 100 to 4,000 mJ/cm$^2$. After the exposure, post exposure baking (PEB) is performed at a temperature between about 50 to 150° C. for between about 10 to 600 seconds. Then, in exposed regions of the film, acid generated from the photo acid generator causes the protecting groups to be dissociated from the polyimide precursors, and consequently, the dissolution rate of the exposed regions in any alkaline developer significantly increases compared with unexposed regions. This difference in dissolution rate allows the exposed regions of the film to be selectively dissolved in the developer. Following this developing process, the film is washed with distilled water or with alcohols and then dried to provide a substrate having a patterned film made of polyimide precursors on its surface.

Generally, resolution of a photosensitive resin is defined as an aspect ratio, d/w, wherein "d" represents a thickness of a pattern made from the resin and "w" represents a line width of the pattern. The photosensitive resin composition of the present invention can achieve high resolution corresponding to an aspect ratio of 3.0 due to the outstanding properties thereof such as high transparency and dissolution rate, etc. Thus, a pattern with a minimum line width of 5 $\mu$m can be formed in a 10 $\mu$m-thick film after curing.

The patterned film made of polyimide precursors thus obtained is subjected to heat treatment in order to convert the polyimide precursors into polyimide. Such heat treatment is carried out stepwise or continuously at a temperature range of between about 100 to 450° C. for between about 0.5 to 5 hours under vacuum condition, under a nitrogen atmosphere or under an air atmosphere. During this heat curing process, in addition to the imidization of polyimide precursors (i.e., polyamic ester and polyamic acid) into polyimide, intermolecular cross-linking reactions also occur between reactive end-capping groups of the precursors to yield polyimide molecules having a higher molecular weight than prior to cross-linking.

The polyimide resin thus produced has relatively high Tg and Td values and is also good in physical properties including strength, modulus, elongation, coefficient of thermal expansion, remained stress, insulation capacity, hygroscopicity, etc. Further, it can function as a photoresist by itself.

Therefore, polyimide films formed by using the photosensitive polyimide precursor composition according to the present invention are useful as interlayer insulating films or protective films of various electronic appliances, including interlayer insulating films, buffer coating films and passivation films of semiconductor devices as well as interlayer insulating films of multi-layer print-circuit boards (PCBs).

The present invention may be more clearly understood with reference to the following examples. It should be understood that the following examples are not intended to restrict the scope of the present invention in any manner.

EXAMPLE 1

Step 1

Synthesis of Polyamic Acid

To a 1 L round-bottomed flask were sequentially added 13.6 g of MDA(4,4'-diaminodiphenylmethane) and 83 g of NMP(N-methyl-2-pyrrolidone) and stirred slowly to dissolve completely. While keeping the flask at room temperature by means of a water bath, 17.37 g of ODPA(4,4'-oxydiphthalic dianhydride) was slowly added to the flask while stirring. The resulting solution was stirred for an additional 2 hours to react sufficiently, and then 4.6 g of NDA(5-norbonene-2,3-dicarboxylic anhydride) was slowly added thereto and stirred at room temperature for 16 hours to provide a polyamic acid solution containing 30 wt % of solid component.

Step 2

Synthesis of Polyamic Ester

To a 1 L round-bottomed flask were sequentially added 3.44 g of BAPB (1,4-bis(4-aminophenoxy)benzene), 9.42 g of ODA (4,4'-diaminodiphenylether) and 140 g of NMP and stirred slowly to dissolve completely. While keeping the flask at room temperature by means of a water bath, 1.24 g of PMDA(pyromellitic dianhydride) and 15.92 g of ODPA were slowly added to the flask while stirring. The resulting solution was stirred for an additional 2 hours to react sufficiently, and then 0.49 g of NDA was slowly added thereto and stirred at room temperature for 16 hours. The water bath was then replaced with an ethylene glycol/dry ice bath to down the temperature of the solution to –25° C., and 50 ml of NMP was added to dilute the solution, and 7.26 g of TEA (triethylamine) in 30 ml of NMP was slowly added to the diluted solution while stirring. Throughout this addition procedure, the temperature of the solution was maintained at –25° C. After the addition of TEA was completed, the solution was further stirred for about 10 minutes so that TEA could be homogeneously mixed, and then 7.18 g of CME(chloromethylethylether) in 30 ml of NMP was slowly added thereto and stirred for 2 hours to react sufficiently. While keeping the resulting solution cool, triethylammonium chloride was filtrated out from the solution, and the filtrate was gently poured to a mixture of 1L of methanol and 2L of distilled water to precipitate a white powder. The wet powder was recovered through filtration and washed with about 5 L of distilled water. The washed powder was then dried in a vacuum oven at 40° C. for 36 hours. 35 g of the dry powder was dissolved in 82 g of NMP to provide a polyamic ester solution containing 30 wt % of solid component.

Step 3

Preparation of a Composition Comprising Photosensitive Polyimide Precursors A photosensitive polyimide precursor solution was prepared by mixing 6 g of the polyamic acid solution obtained from Step 1 with 14 g of the polyamic ester solution obtained from Step 2. Subsequently, 1.2 g of DNQ404 (diazonaphthoquinone based) as a photo acid generator was added to the mixture and dissolved. The resulting solution was then filtrated through a 0.1 $\mu$m filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 80° C. for 6 minutes, so that a resinous film with a thickness of 15 $\mu$m was formed. A photomask was then vacuum-pressed against the coated silicon wafer, and UV light with a wavelength of 365 nm was irradiated thereto in a light amount of 1,000 mJ/cm$^2$ using a high-pressure mercury lamp. Next, the silicon wafer was subject to PEB (post exposure baking) process at 125° C. for 5 minutes and developed with 2.38 wt % TMAH (tetramethylammoniumhydroxide) solution for 3 minutes and washed with distilled water to give a clear-patterned film. Then, the patterned film was completed through sequential heat treatment (at 80° C. for 10 minutes, at 120° C. for 60 minutes, and at 300° C. for 60 minutes) on a hot plate under a nitrogen atmosphere to provide a patterned film that is 8 $\mu$m in minimum line width and 10 $\mu$m in thickness.

Step 5

Assessment of Physical Properties of the Film

A glass substrate was bar-coated with the photosensitive polyimide precursor composition obtained from Step 3, and then heat-treated on a hot plate, sequentially, at 80° C. for 10 minutes, at 180° C. for 60 minutes and at 300° C. for 60 minutes, so that a polyimide film having a thickness of 10 $\mu$m was formed. The film was separated from the substrate by pressure cooking treatment (PCT) at 125° C. under a pressure of 2.3 atm for 30 min in an autoclave. The separated film was cut into pieces having a width of 1 cm and a length of 3 cm, and then applied to a tensile tester to assess the tension property of the film. As a result, tensile strength was determined as 150 Mpa, modulus as 3.0 GPa, and elongation as 13%, respectively.

EXAMPLE 2

Step 1

Synthesis of Polyamic Acid

To a 1 L round-bottomed flask were sequentially added 13.6 g of MDA and 83 g of NMP and stirred slowly to dissolve completely. While keeping the flask at room temperature by means of a water bath, 17.37 g of ODPA was slowly added to the flask while stirring. The resulting solution was stirred for an additional 2 hours to react sufficiently, and then 2.3 g of NDA and 1.6 g of IA (itaconic acid) were slowly added thereto and stirred at room temperature for 16 hours to provide a polyamic acid solution containing 30 wt % of solid component.

Step 2

Synthesis of Polyamic Ester

To a 1 L round-bottomed flask were sequentially added 3.44 g of BAPB, 9.42 g of ODA and 140 g of NMP and stirred slowly to dissolve completely. While keeping the flask at room temperature by means of a water bath, 1.24 g of PMDA and 15.92 g of ODPA were slowly added to the flask while stirring. The resulting solution was stirred for an additional 2 hours to react sufficiently, and then 0.25 g of NDA and 0.17 g of IA (itaconic acid) were slowly added thereto and stirred at room temperature for 16 hours. The water bath was then replaced with an ethylene glycol/dry ice bath to down the temperature of the solution to −25° C., and 50 ml of NMP was added to dilute the solution, and 7.26 g of TEA in 30 ml of NMP was slowly added to the diluted solution while stirring. Throughout this addition procedure, the temperature of the solution was maintained at −25° C. After the addition of TEA was completed, the solution was further stirred for about 10 minutes so that TEA could be homogeneously mixed, and then 7.18 g of CME in 30 ml of NMP was slowly added thereto and stirred for 2 hours to react sufficiently. While keeping the resulting solution cool, triethylammonium chloride was filtrated out from the solution, and the filtrate was gently poured to a mixture of 1 L of methanol and 2 L of distilled water to precipitate a white powder. The wet powder was recovered through filtration and washed with about 5 L of distilled water. The washed powder was then dried in a vacuum oven at 40° C. for 36 hours. 35 g of the dry powder was dissolved in 82 g of NMP to provide a polyamic ester solution containing 30 wt % of solid component.

Step 3

Preparation of a Composition Comprising Photosensitive Polyimide Precursors A photosensitive polyimide precursor solution was prepared by mixing 6 g of the polyamic acid solution obtained from Step 1 with 14 g of the polyamic ester solution obtained from Step 2. Subsequently, 1.2 g of DNQ404 as a photo acid generator was added to the mixture and dissolved. The resulting solution was then filtrated through a 0.1 $\mu$m filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 80° C. for 6 minutes, so that a resinous film having a thickness of 15 $\mu$m was formed. A photomask was then vacuum-pressed against the coated silicon wafer, and UV light having a wavelength of 365 nm was irradiated thereto in a light amount of 1,000 mJ/cm$^2$ by using a high-pressure mercury lamp. Next, the silicon wafer was subject to PEB (post exposure baking) process at 125° C. for 5 minutes and developed with 2.38 wt % TMAH solution for 3 minutes and washed with distilled water to provide a clear-patterned film. The patterned film was then completed through sequential heat treatment (at 80° C. for 10 minutes, at 1 20° C. for 60 minutes, and at 300° C. for 60 minutes) on a hot plate under a nitrogen atmosphere to provide a patterned film that is 1 $\mu$m in minimum line width and 10 $\mu$m in thickness.

Step 5

Assessment of Physical Properties of the Film

A glass substrate was bar-coated with the photosensitive polyimide precursor composition obtained from Step 3, and then heat-treated on a hot plate, sequentially, at 80° C. for 10 minutes, at 180° C. for 60 minutes and at 300° C. for 60 minutes, so that a polyimide film having a thickness of 10 $\mu$m was formed. The film was separated from the substrate by pressure cooking treatment (PCT) at 125° C. under a pressure of 2.3 atm for 30 min in an autoclave. The separated film was cut into pieces having a width of 1 cm and a length of 3 cm, and then applied to a tensile tester to assess the tension property of the film. As a result, tensile strength was determined as 139 Mpa, modulus as 3.1 GPa, and elongation as 33%, respectively.

EXAMPLE 3

Step 1

Synthesis of Polyamic Acid

To a 1 L round-bottomed flask were sequentially added 21.98 g of ODA, 6.82 g of SDA (siloxanediamine) and 170 g of NMP and stirred slowly to dissolve completely. While keeping the flask at room temperature by means of a water bath, 34.74 g of ODPA was slowly added to the flask while stirring. The resulting solution was stirred for an additional 2 hours to react sufficiently, and then 7.06 g of DMMA was slowly added thereto and stirred at room temperature for 16 hours to provide a polyamic acid solution containing 30 wt % of solid component.

Step 2

Synthesis of Polyamic Ester

To a 1 L round-bottomed flask were sequentially added 3.44 g of BAPB, 9.42 g of ODA and 140g of NMP and stirred slowly to dissolve completely. While keeping the flask at room temperature by means of a water bath, 1.24 g of PMDA and 15.92 g of ODPA were slowly added to the flask while stirring. The resulting solution was stirred for an additional 2 hours to react sufficiently, and then 0.49 g of NDA was slowly added thereto and stirred at room temperature for 16 hours. The water bath was then replaced with an ethylene glycol/dry ice bath to down the temperature of the solution to −25° C., and 50 ml of NMP was added to dilute the solution, and 7.26 g of TEA in 30 ml of NMP was slowly added to the diluted solution while stirring. Throughout this addition procedure, the temperature of the solution was maintained at −25° C. After the addition of TEA was completed, the solution was further stirred for about 10 minutes so that TEA could be homogeneously mixed, and then 7.18 g of CME in 30 ml of NMP was slowly added thereto and stirred for 2 hours to react sufficiently. While keeping the resulting solution cool, triethylammonium chloride was filtrated out from the solution, and the filtrate was gently poured to a mixture of 1 L of methanol and 2 L of distilled water to precipitate a white powder. The wet powder was recovered through filtration and washed with about 5 L of distilled water. The washed powder was then dried in a vacuum oven at 40° C. for 36 hours. 35 g of the dry powder was dissolved in 82 g of NMP to provide a polyamic ester solution containing 30 wt % of solid component.

Step 3

Preparation of a Composition Comprising Photosensitive Polyimide Precursors

A photosensitive polyimide precursor solution was prepared by mixing 6 g of the polyamic acid solution obtained from Step 1 with 14 g of the polyamic ester solution obtained from Step 2. Subsequently, 0.6 g of DINS-15 (diphenyliodonium-based) and 0.3 g of KJ-1115 (triarylsulfonium-based) as photo acid generator were added to the mixture and dissolved. The resulting solution was then filtrated through a 0.1 $\mu$m filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 80° C. for 6 minutes, so that a resinous film having a thickness of 15 $\mu$m was formed. A photomask was then vacuum-pressed against the coated silicon wafer, and UV light having a wavelength of 365 nm was irradiated thereto in a light amount of 1,000 mJ/cm$^2$ by using a high-pressure mercury lamp. The silicon wafer was then subject to PEB (post exposure baking) process at 125° C. for 5 minutes and developed with 2.38 wt % TMAH solution for 3 minutes and washed with distilled water to provide a clear-patterned film. The patterned film was then completed through sequential heat treatment (at 80° C. for 10 minutes, at 120° C. for 60 minutes, and at 300° C. for 60 minutes) on a hot plate under a nitrogen atmosphere to provide a patterned film that is 5 $\mu$m in minimum line width and 10 $\mu$m in thickness.

Step 5

Assessment of Physical Properties of the Film

A glass substrate was bar-coated with the photosensitive polyimide precursor composition obtained from Step 3, and then heat-treated on a hot plate, sequentially, at 80° C. for 10 minutes, at 120° C. for 60 minutes and at 300° C. for 60 minutes, so that a polyimide film having a thickness of 10 $\mu$m was formed. The film was separated from the substrate by dipping the coated glass substrate in a 5% aqueous HF (hydrofluoric acid) solution at room temperature for 30 minutes. The separated film was cut into pieces having a width of 1 cm and a length of 3 cm, and then applied to a tensile tester to assess the tension property of the film. As a result, tensile strength was determined as 140 Mpa, modulus as 2.6 GPa, and elongation as 35%, respectively.

EXAMPLE 4

Step 1

Synthesis of Polyamic Acid

To a 1 L round-bottomed flask were sequentially added 1.72 g of BAPB, 4.71 g of ODA and 37 g of NMP and stirred slowly to dissolve completely. While keeping the flask at room temperature by means of a water bath, 2.67 g of 6FDA (4,4'-hexafluoroisopropylidene bis(phthalic anhydride)), 0.65 g of PMDA and 6.14 g of ODPA were slowly added to the flask while stirring. The resulting solution was stirred for an additional 2 hours to react sufficiently, and then 0.2 g of NDA was slowly added thereto and stirred at room temperature for 16 hours to provide a polyamic acid solution containing 30 wt % of solid component.

Step 2

Synthesis of Polyamic Ester

To a 1 L round-bottomed flask were sequentially added 3.44 g of BAPB, 9.42 g of ODA and 140 g of NMP and stirred slowly to dissolve completely. While keeping the flask at room temperature by means of a water bath, 1.24 g of PMDA and 15.92 g of ODPA were slowly added to the flask while stirring. The resulting solution was stirred for an additional 2 hours to react sufficiently, and then 0.49 g of NDA was slowly added thereto and stirred at room temperature for 16 hours. The water bath was then replaced with an ethylene glycol/dry ice bath to down the temperature of the solution to −25° C., and 50 ml of NMP was added to dilute the solution, and 7.26 g of TEA in 30 ml of NMP was slowly added to the diluted solution while stirring. Throughout this addition procedure, the temperature of the solution was maintained at −25° C. After the addition of TEA was completed, the solution was further stirred for about 10 minutes so that TEA could be homogeneously mixed, and then 7.18 g of CME in 30 ml of NMP was slowly added thereto and stirred for 2 hours to react sufficiently. While keeping the resulting solution cool, triethylammonium chloride was filtrated out from the solution, and the filtrate was gently poured to a mixture of 1 L of methanol and 2 L of distilled water to precipitate a white powder. The wet powder was recovered through filtration and washed with about 5 L of distilled water. The washed powder was then dried in a vacuum oven at 40° C. for 36 hours. 35 g of the dry powder was dissolved in 82 g of NMP to provide a polyamic ester solution containing 30 wt % of solid component.

Step 3

Preparation of a Composition Comprising Photosensitive Polyimide Precursors

A photosensitive polyimide precursor solution was prepared by mixing 6 g of the polyamic acid solution obtained from Step 1 with 14 g of the polyamic ester solution obtained from Step 2. Subsequently, 1.2 g of DNQ404 as a photo acid generator was added to the mixture and dissolved. The resulting solution was then filtrated through a 0.1 μm filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 80° C. for 6 minutes, so that a resinous film having a thickness of 15 μm was formed. A photomask was then vacuum-pressed against the coated silicon wafer, and UV light having a wavelength of 365 nm was irradiated thereto in a light amount of 1,000 mJ/cm² by using a high-pressure mercury lamp. Next, the silicon wafer was subject to PEB (post exposure baking) process at 125° C. for 5 minutes and developed with 2.38 wt % TMAH solution for 3 minutes and washed with distilled water to give a clear-patterned film. The patterned film was then completed through sequential heat treatment (at 80° C. for 10 minutes, at 120° C. for 60 minutes, and at 300° C. for 60 minutes) on a hot plate under a nitrogen atmosphere to provide a patterned film that is 10 μm in minimum line width and 9.5 μm in thickness.

Step 5

Assessment of Physical Properties of the Film

A glass substrate was bar-coated with the photosensitive polyimide precursor composition obtained from Step 3, and then heat-treated on a hot plate, sequentially, at 80° C. for 10 minutes, at 180° C. for 60 minutes and at 320° C. for 60 minutes, so that a polyimide film having a thickness of 10 μm was formed. The film was separated from the substrate by pressure cooking treatment (PCT) at 125° C. under a pressure of 2.3 atm for 30 min in an autoclave. The separated film was cut into pieces having a width of 1 cm and a length of 3 cm, and then applied to a tensile tester to assess the tension property of the film. As a result, tensile strength was determined as 130 Mpa, modulus as 2.8 GPa, and elongation as 30%, respectively.

EXAMPLE 5

Step 1

Synthesis of Polyamic Acid

To a 1 L round-bottomed flask were sequentially added 27.48 g of ODA and 168 g of NMP and stirred slowly to dissolve completely. While keeping the flask at room temperature by means of a water bath, 24.43 g of PMDA was slowly added to the flask while stirring. The resulting solution was stirred for an additional 2 hours to react sufficiently, and then 9.19 g of NDA was slowly added thereto and stirred at room temperature for 16 hours to provide a polyamic acid solution containing 30 wt % of solid component.

Step 2

Synthesis of Polyamic Ester

To a 1 L round-bottomed flask were sequentially added 27.48 g of ODA and 280 g of NMMP and stirred slowly to dissolve completely. While keeping the flask at room temperature by means of a water bath, 39.08 g of ODPA was slowly added to the flask while stirring. The resulting solution was stirred for an additional 2 hours to react sufficiently, and then 3.53 g of DMMA was slowly added thereto and stirred at room temperature for 16 hours. The water bath was then replaced with an ethylene glycol/dry ice bath to down the temperature of the solution to −25° C., and 100 ml of NMP was added to dilute the solution, and 22.90 g of TEA in 50 ml of NMP was slowly added to the diluted solution while stirring. Throughout this addition procedure, the temperature of the solution was maintained at −25° C. After the addition of TEA was completed, the solution was further stirred for about 10 minutes so that TEA could be homogeneously mixed, and then 23.16 g of CME in 50 ml of NMP was slowly added thereto and stirred for 2 hours to react sufficiently. While keeping the resulting solution cool, triethylammonium chloride was filtrated out from the solution, and the filtrate was gently poured to a mixture of 1.5 L of methanol and 3.5 L of distilled water to precipitate a white powder. The wet powder was recovered through filtration and washed with about 5 L of distilled water. The washed powder was then dried in a vacuum oven at 40° C. for 36 hours. 76 g of the dry powder was dissolved in 177 g of NMP to provide a polyamic ester solution containing 30 wt % of solid component.

Step 3

Preparation of a Composition Comprising Photosensitive Polyimide Precursors

A photosensitive polyimide precursor solution was prepared by mixing 6 g of the polyamic acid solution obtained from Step 1 with 14 g of the polyamic ester solution obtained from Step 2. Subsequently, 0.6 g of DINS-15 and 0.3 g of KJ-1115 as photo acid generator were added to the mixture and dissolved. The resulting solution was then filtrated through a 0.1 $\mu$m filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 80° C. for 6 minutes, so that a resinous film having a thickness of 15 $\mu$m was formed. A photomask was then vacuum-pressed against the coated silicon wafer, and UV light having a wavelength of 365 nm was irradiated thereto in a light amount of 1,000 mJ/cm$^2$ by using a high-pressure mercury lamp. Next, the silicon wafer was subject to PEB (post exposure baking) process at 125° C. for 5 minutes and developed with 2.38 wt % TMAH solution for 3 minutes and washed with distilled water to give a clear-patterned film. The patterned film was then completed through sequential heat treatment (at 80° C. for 10 minutes, at 120° C. for 60 minutes, and at 310° C. for 60 minutes) on a hot plate under a nitrogen atmosphere to provide a patterned film that is 5 $\mu$m in minimum line width and 10 $\mu$m in thickness.

Step 5

Assessment of Physical Properties of the Film

A glass substrate was spin coated with the photosensitive polyimide precursor composition obtained from Step 3, and then heat-treated on a hot plate, sequentially, at 80° C. for 10 minutes, at 120° C. for 60 minutes and at 300° C. for 60 minutes, so that a polyimide film having a thickness of 10$\mu$m was formed. The film was separated from the substrate by pressure cooking treatment (PCT) at 125° C. under a pressure of 2.3 atm for 30 min in an autoclave. The separated film was cut into pieces having a width of 1 cm and a length of 3 cm, and then applied to a tensile tester to assess the tension property of the film. As a result, tensile strength was determined as 130 Mpa, modulus as 2.6 GPa, and elongation as 27%, respectively.

EXAMPLE 6

1. Synthesis of Polyamic Acid

To a 1 L round-bottomed flask were sequentially added 1.22 g of SDA, 18.64 g of ODA and 118 g of NMP and stirred slowly to dissolve completely. While keeping the flask at room temperature by means of a water bath, 24.82 g of ODPA was slowly added to the flask while stirring. The resulting solution was stirred for an additional 2 hours to react sufficiently, and then 3.28 g of NDA and 2.58 g of DMMA was slowly added thereto and stirred at room temperature for 16 hours to provide a polyamic acid solution containing 30 wt % of solid component.

Step 2

Synthesis of Polyamic Ester

To a 1 L round-bottomed flask were sequentially added 4.01 g of BAPB, 10.99 g of ODA and 110 g of NMP and stirred slowly to dissolve completely. While keeping the flask at room temperature by means of a water bath, 19.54 g of ODPA were slowly added to the flask while stirring. The resulting solution was stirred for an additional 2 hours to react sufficiently, and then 2.30 g of NDA was slowly added thereto and stirred at room temperature for 16 hours. The water bath was then replaced with an ethylene glycol/dry ice bath to down the temperature of the solution to –25° C., and 60 ml of NMP was added to dilute the solution, and 11.45 g of TEA in 30 ml of NMP was slowly added to the diluted solution while stirring. Throughout this addition procedure, the temperature of the solution was maintained at –25° C. After the addition of TEA was completed, the solution was further stirred for about 10 minutes so that TEA could be homogeneously mixed, and then 11.58 g of CME in 30 ml of NMP was slowly added thereto and stirred for 2 hours to react sufficiently. While keeping the resulting solution cool, triethylammonium chloride was filtrated out from the solution, and the filtrate was gently poured to a mixture of 1 L of methanol and 2 L of distilled water to precipitate a white powder. The wet powder was recovered through filtration and washed with about 5 L of distilled water. The washed powder was then dried in a vacuum oven at 40° C. for 36 hours.

Step 3

Preparation of a Composition Comprising Photosensitive Polyimide Precursors

A photosensitive polyimide precursor solution was prepared by mixing 14 g of the polyamic acid solution obtained from Step 1 with 1.8 g of the polyamic ester resin obtained from Step 2 and 2 g of NMP. Subsequently, 0.3 g of DNQ404, 0.3 g of DINS-15 and 0.3 g of KJ-1115 as photo acid generators and 0.6 g of 4,4'-isopropylidenediphenol as an additive were added to the mixture and dissolved. The resulting solution was then filtrated through a 0.1 $\mu$m filter to provide a photosensitive polyimide precursor composition.

Step 4

Measurement of Resolution

A 4-inch silicon wafer was spin coated with the photosensitive polyimide precursor composition obtained from Step 3, and then heated on a hot plate at 90° C. for 3 minutes, so that a resinous film having a thickness of 15 $\mu$m was formed. A photomask was then vacuum-pressed against the coated silicon wafer, and UV light having a broad wavelength ranging from 340 nm to 450 nm was irradiated thereto in a light amount of 700 mJ/cm$^2$ by using a high-pressure mercury lamp without color filter. The silicon wafer was then subject to PEB (post exposure baking) process at 130° C. for 2 minutes and developed with 2.38 wt % TMAH solution for 3 minutes and washed with distilled water to give a clear-patterned film. The patterned film was then completed through sequential heat treatment (at 180° C. for 60 minutes, and at 350° C. for 60 minutes) on a hot plate under a nitrogen atmosphere to provide a patterned film that is 5 $\mu$m in minimum line width and 10 $\mu$m in thickness.

Step 5

Assessment of Physical Properties of the Film

A glass substrate was bar-coated with the photosensitive polyimide precursor composition obtained from Step 3, and then heat-treated on a hot plate, sequentially, at 180° C. for 60 minutes and at 350° C. for 60 minutes, so that a polyimide film having a thickness of 10 $\mu$m was formed. The film was separated from the substrate by pressure cooking treatment (PCT) at 125° C. under a pressure of 2.3 atm for 30 min in an autoclave. The separated film was cut into pieces having a width of 1 cm and a length of 3 cm, and then applied to a tensile tester to assess the tension property of the film. As a result, tensile strength was determined as 176 Mpa, modulus as 3.1 GPa, and elongation as 31%, respectively.

As stated above, there is provided a novel polyimide precursor having improved dissolution rate, transparency, physical properties, adhesiveness, etc. The novel polyimide precursor can provide resinous films, which are excellent in thermal, electrical and mechanical properties and therefore useful as interlayer insulating films or protective films of various electronic appliances including highly-integrated semiconductor devices and multi-layer print-circuit boards PCBs). Taking advantage of the present invention, a high-resolution pattern can be formed even at a film thickness of 10 μm or more.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A polyamic ester prepared by partially substituting hydrogen atoms of carboxylic groups of a polyamic acid with acid labile groups that are functional groups capable of binding to a carboxylic group and degrading to yield carboxylic acid upon generation of acid by exposure, the polyamic ester comprising one or more repeating units represented by Formula 1, and each of at least one terminal of said polyamic ester molecule terminates with the same or different reactive end-capping monomer:

Formula (1)

wherein in Formula 1,
R$_1$ and R$_2$ are independently a hydrogen atom, or an acid labile group;
X is a tetravalent, an aromatic or an aliphatic organic group;
Y is a divalent, an aromatic or an aliphatic organic group; and
m is an integer equal to or greater than 1.

2. The polyamic ester as claimed in claim 1, wherein the reactive end-capping monomer is one or more selected from the group consisting of monoamines and monoanhydrides having a C—C double bond.

3. The polyamic ester as claimed in claim 2, wherein the reactive end-capping monomer is 5-norbonene-2,3-dicarboxylic anhydride(NDA) represented by Formula 9:

Formula (9)

4. The polyamic ester as claimed in claim 2, wherein the reactive end-capping monomer is itaconic anhydride (IA) represented by Formula 10:

Formula (10)

5. The polyamic ester as claimed in claim 2, wherein the reactive end-capping monomer is 2,3-dimethylmaleic anhydride (DMMA) represented by Formula 11:

Formula (11)

6. The polyamic ester as claimed in claim 1,
wherein the acid labile group is —CHR$_3$—O—R$_4$,
wherein, R$_3$ is a hydrogen atom, or a C$_{1\sim20}$ saturated or unsaturated hydrocarbon or aromatic organic group that may contain one or more heteroatoms,
R$_4$ is a C$_{1\sim20}$ saturated or unsaturated hydrocarbon or aromatic organic group that may contain one or more heteroatoms, and
R$_3$ and R$_4$ may be interconnected to form a ring structure;
tert-butyl;
or trimethylsilyl.

7. The polyamic ester as claimed in claim 1,
wherein the value of b/(a+b) ranges from 0.1 to 1.0,
wherein "a" represents a total number of hydrogen atoms contained in the carboxylic groups of the polyamic ester molecule and
"b" represents a total number of the acid labile groups contained in the carboxylic groups of the polyamic ester molecule.

8. A polyimide precursor mixture, comprising at least one polyamic ester as claimed in claim 1 and at least one polyamic acid, the polyamic acid comprising one or more repeating units represented by Formula 6 and each of at least one terminal of the polyamic acid molecule terminating with the same or different reactive end-capping monomer:

Formula (6)

wherein in Formula 6,
X is a tetravalent, an aromatic or an aliphatic organic group;
Y is a divalent, an aromatic or an aliphatic organic group; and
n is an integer equal to or greater than 1.

9. The polyimide precursor mixture as claimed in claim 8, wherein the reactive end-capping monomer is one or more selected from the group consisting of monoamines and monoanhydrides having a C—C double bond.

10. The polyimide precursor mixture as claimed in claim 9, wherein the reactive end-capping monomer is 5-norbonene-2,3-dicarboxylic anhydride (NDA) represented by Formula 9:

Formula (9)

11. The polyimide precursor mixture as claimed in claim 9, wherein the reactive end-capping monomer is itaconic anhydride (IA) represented by Formula 10:

Formula (10)

12. The polyimide precursor mixture as claimed in claim 9, wherein the reactive end-capping monomer is 2,3-dimethylmaleic anhydride (DMMA) represented Formula 11:

Formula (11)

13. The polyimide precursor mixture as claimed in claim 8, wherein 1 to 50% of Y groups contained in the polyamic acid is a siloxane unit represented by Formula 7:

Formula (7)

wherein in Formula 7,
$R_5$, $R_6$, $R_7$ and $R_8$ are independently an alkyl, an aryl, an alkoxy or a hydroxyl group, that may contain one or more heteroatoms;
$R_9$ and $R_{10}$ are independently an alkyl or an aryl group; and
k is an integer equal to or greater than 1.

14. The polyimide precursor mixture as claimed in claim 8, wherein the value of A/(A+B) ranges from 0.05 to 0.95, and
wherein "A" represents a total weight of the polyamic ester and "B" represents a total weight of the polyamic acid.

15. A photosensitive polyimide precursor composition, comprising
(a) the polyimide precursor mixture as claimed in claim 8,
(b) one or more photo acid generators and
(c) one or more polar solvents.

16. The photosensitive polyimide precursor composition as claimed in claim 15, wherein the composition further comprises one or more compounds having a hydroxyl group selected from the group consisting of alcohols, benzylalcohols and phenols.

17. The photosensitive polyimide precursor composition as claimed in claim 15, wherein the content of the photo acid generator is 0.1 to 50 weight parts based on 100 weight parts of the polyimide precursor mixture.

18. The photosensitive polyimide precursor composition as claimed in claim 15, wherein solid content of the composition ranges from 5 to 60 wt %.

19. The photosensitive polyimide precursor composition as claimed in claim 15, wherein the photo acid generator is selected from the group consisting of halogenated compounds, sulfonyl compounds, ammonium salts, diazonium salts, iodonium salts, sulfonium salts, phosphonium salts, onium salts of polymers, selenium salts and arsenium salts.

20. The photosensitive polyimide precursor composition as claimed in claim 15,
wherein the polar solvent is selected from the group consisting of N-methyl-2-pyrrolidone;
N,N'-dimethylacetamide;
dimethylformamide; dimethyl sulfoxide;
acetonitrile;
diglyme(diethylene glycol dimethyl ether);
γ-butyrolactone;
phenol;
cresol;

xylenol;

hexamethylenephosphoric triamide;

and pyridine.

21. A photosensitive, insulating film or protective film formed using the photosensitive polyimide precursor composition as claimed in claim 15.

22. A semiconductor device, wherein an insulating film, a passivation film or a buffer coating film thereof was formed using the photosensitive polyimide precursor composition as claimed in claim 15.

* * * * *